United States Patent [19]

Hoshino et al.

[11] Patent Number: 4,479,686

[45] Date of Patent: Oct. 30, 1984

[54] CONNECTOR

[75] Inventors: Mitsuo Hoshino, Atsugi; Osamu Fukushima, Kawasaki; Toshio Kakuta, Higashiosaka, all of Japan

[73] Assignees: Sony Corporation, Tokyo; Hosiden Electronics Co. Ltd., Osaka, both of Japan

[21] Appl. No.: 443,075

[22] Filed: Nov. 19, 1982

[30] Foreign Application Priority Data

Nov. 24, 1981 [JP] Japan .......................... 56-174900[U]

[51] Int. Cl.³ ............................................. H05K 1/06

[52] U.S. Cl. .......................... 339/17 LC; 339/126 R; 339/176 MP; 339/218 M

[58] Field of Search ............ 339/17 L, 17 LC, 126 R, 339/176 MP, 17 C, 17 LM, 17 M, 126 RS, 126 J, 128, 176 MF, 75 MP, 17 D, 218 M

[56] References Cited

U.S. PATENT DOCUMENTS 2,774,949 12/1956 Cardani et al. .................... 339/128
4,077,693 3/1978 Briel, Jr. et al. ............... 339/126 R

FOREIGN PATENT DOCUMENTS 1091732 11/1967 United Kingdom ........... 339/126 R

*Primary Examiner*—Eugene F. Desmond
*Assistant Examiner*—Steven C. Bishop
*Attorney, Agent, or Firm*—Pollock, Vande Sande and Priddy

[57] ABSTRACT

A connector body has a plurality of contacts and a plug hole made in a front face of the connector for receiving a plug. Terminals connected to the contacts are led out to extend perpendicularly to the lengthwise direction of the plug hole along a side surface of the connector body adjacent the front face in which the plug hole is made. The outer peripheral surface of the connector body is shaped to permit control of the depth of insertion of the connector body into a connector insertion hole in a printed-circuit board. The actual insertion depth is determined by selection of the shape of the connector insertion hole in the printed-circuit board, by which the connector terminals can be connected to laminar conductors deposited on either one or both of the surfaces of the printed-circuit board.

6 Claims, 6 Drawing Figures

CONNECTOR

BACKGROUND OF THE INVENTION

The present invention relates to a connector, for use with printed-circuit boards, which has a plurality of contacts arranged in its plug hole for engagement with contacts of a plug loaded thereinto.

In conventional connectors of this kind, contact terminals are formed to project out on one side of the connector body, generally on the opposite side from a plug hole. The contact terminals are respectively inserted into small holes made in a printed-circuit board, wherein they are connected to conductors deposited on the printed-circuit board. The packing density on the printed-circuit board could be improved by reducing the spacing of the contact terminals. Since there is a limit to making the small holes in the printed-circuit board in close proximity to adjacent ones of them, however, the packing density cannot appreciably be increased. Furthermore, the connections between the contact terminals of the connector and the conductors on the printed-circuit board are usually made by soldering them on the side of the board opposite from the surface on which the connector is mounted. Accordingly, feasibility of circuit design and utilization efficiency of the printed-circuit board area are limited.

SUMMARY OF THE INVENTION

It is an object of the present invention to provide a connector which permits the reduction of the spacing of the connector terminals to provide for enhanced packing density on printed-circuit board.

It is another object to provide a connector which is provided with insertion depth setting means for insertion of the connector to a connector receiving hole made in a printed-circuit board by a desired one of a plurality of predetermined depths thereby allowing connections between contact terminals of the connector and conductors of the printed-circuit board on either the front or rear surfaces or on the both surfaces thereof.

According to the present invention, a connector body is a substantially rectangular parallelepiped formed of an insulating material and has a plug hole made in its front face extending in the lengthwise direction thereof for receiving a plug. On each inner side wall of the plug hole a plurality of contacts are arranged in the lengthwise direction of the connector body. Contact terminals connected to the contacts are led out to extend perpendicularly to the lengthwise direction of the connector body on its both sides adjacent to the front face in which the plug hole is formed. On the outer peripheral surface of the connector body, insertion depth setting means is provided for selectively defining the insertion depth of the connector body when one part thereof is inserted into a connector receiving hole opened through an insulating substrate (a printed-circuit board) for loading thereon the connector. This control insertion depth setting means allows selection of a insertion depth with a plurality of stages in the direction of insertion of the connector body. As the insertion depth setting means, guide pieces are formed on both end faces of the connector body to project outwardly therefrom and stepped portions are formed on both side surfaces to form second side surfaces where the thickness of the body is reduced and on which the contact terminals are led out. Letting the distance between the bottom surface (i.e. rear surface) of the connector body on the side of the connector receiving hole of the printed-circuit board and the guide pieces and the distance between the abovesaid bottom surface of the connector body and the stepped portions be represented by $l_1$ and $l_2$, respectively, it is arranged that $l_1 < l_2$.

With such an arrangement, when one part of the connector body is inserted into the connector receiving hole of the printed-circuit board, the contact terminals on the second side walls of the connector body are disposed adjacent laminar conductors deposited on the printed-circuit board to extend to marginal edges of the connector receiving hole, so that they can easily be connected to each other. Since a small hole need not be made for each terminal, the terminal spacing can be reduced. When the connector body is inserted into the connector receiving hole of the printed-circuit board, the insertion depth setting means, that is, either the guide pieces or the stepped portions, depending on the connector receiving holes, abut against the printed-circuit board, controlling the insertion depth of the connector body. As a result of this, the contact terminals can be connected to the laminar conductors formed on one or both surfaces of the printed-circuit board.

DESCRIPTION OF THE PREFERRED EMBODIMENTS

Figure 1:
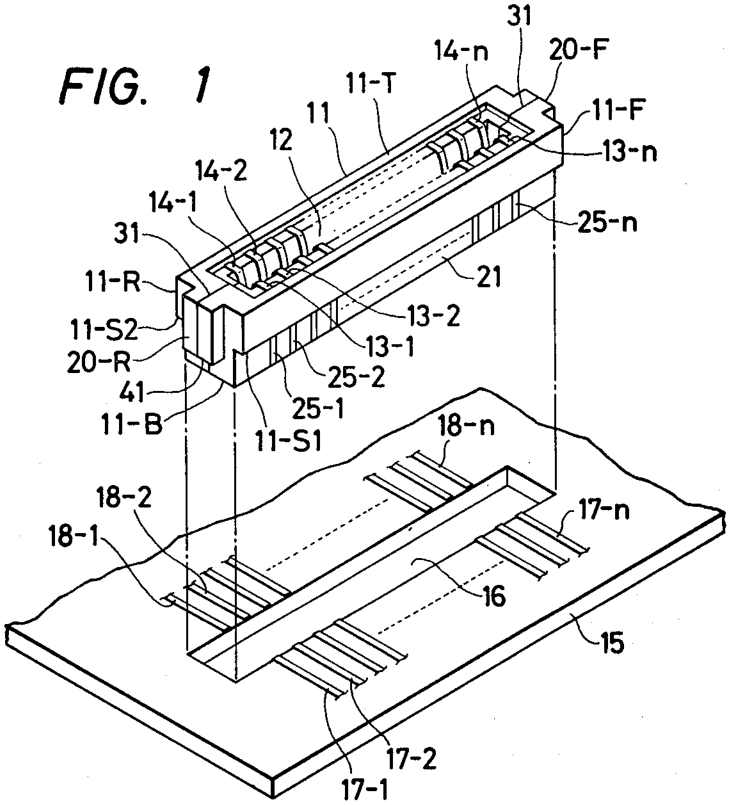
FIG. 1 is a perspective view showing an example of the connector of the present invention and a printed-circuit board on which the connector is loaded.

FIG. 1 illustrates, in perspective, an embodiment of the connector of the present invention and an example of a printed-circuit board on which the connector is to be loaded. A connector body 11 is a substantially rectangular molding of an electrical insulating material, such as synthetic resin. A plug hole 12 is formed in the front face 11-T of the connector body 11 to extend in its lengthwise direction. On the opposing inner side walls of the plug hole 12, there are provided pluralities of contacts 13-1 to 13-n and 14-1 to 14-n which are arranged in the lengthwise direction of the connector body 11. When a plug is inserted into the plug hole 12, contacts of the plug make resilient contact with the contacts 13-1 to 13-n and 4-1 to 14-n.

An insertion hole 16 is formed in a printed-circuit board 15 on which the connector body 11 is loaded, and the insertion hole 16 is substantially rectangular. The connector body 11 is inserted into the insertion hole 16 on the opposite side from the plug hole 12. On the printed-circuit board 15 are formed, as by wire printing techniques, parallel laminar conductors 17-1 to 17-n and 18-1 to 18-n which extend from both longer marginal edges of the insertion hole 16 substantially perpendicularly thereto. The laminar conductors 17-1 to 17-n and 18-1 to 18-n each form a part of a circuit (not shown) formed on the printed-circuit board 15.

Figure 2:
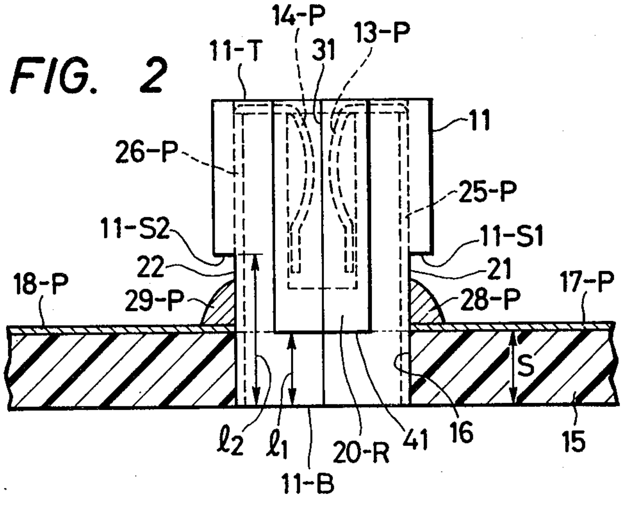
FIG. 2 is a diagram showing the state in which the connector depicted in FIG. 1 is loaded on the printed-circuit board.

Both side surfaces of the connector body 11 extending in its lengthwise direction project outwardly on the side of the front face 11-T to form stepped portions 11-S1 and 11-S2; accordingly, that portion of the connector body 11 which is to be inserted into the insertion hole 16 is smaller in width i.e. thickness than the portion on the side of the plug hole 12. On both side surfaces 21, 22 (22 is not shown in FIG. 1) of the small-width portion of the connector body 11, linear contact terminals 25-1 to 25-n and 26-1 to 26-n (the terminals 26-1 to 26-n being represented by 26-P in FIG. 2), which extend in the direction in which the connector body 11 is pushed into or pulled out of the insertion hole 16, are arranged side by side in the lengthwise direction of the connector body 11. The contact terminals 25-1 to 25-n and 26-1 to 26-n are electrically connected at one end to the contacts 13-1 to 13-n and 14-1 to 14-n.

The connector body 11 is an assembly of two connector halves which are symmetrical, for example, with respect to a line 31 in FIG. 1 and which are obtained by molding. The contacts 13-1, 13-2, . . . and the corresponding terminals 25-1, 25-2, . . . are each formed by one resilient metal strip. When each connector half is produced by molding, metal strips are arranged at predetermined intervals in a mold and formed as a unitary structure with the connector half so that outer surfaces of one end portions of the strips forming the contact terminals are exposed to be substantially flush with the side surface of the connector half where the thickness thereof is reduced, i.e., at a thinner portion of a side wall of the connector body, portions adjacent the exposed one end portions are buried in the connector half along the side surface where the thickness thereof is increased, i.e., at a thicker portion of the side wall of the connector body, and the other end portions intended for the contacts 13-1, 13-2, . . . project out from the front of the connector half perpendicularly thereto. All of the projecting portions of the metal strips are simultaneously bent into a predetermined form such as a U-shape to provide the contacts 13-1, 13-2, . . . The two connector halves thus obtained are assembled by fusing them together using ultrasonic waves or the like, thereby obtaining the connector body 11. In this way, the connector is formed by molding together with such metal strip arrays, so that there is no need to make holes in the connector for the insertion thereinto of the contacts and the spacing of the contacts and the spacing of the contacts can be reduced.

In order that, when the connector body 11 is loaded into the insertion hole 16 of the printed-circuit board 15, the position of the connector body 11 relative to the board 15 may be controlled in a plurality of stages, the connector body 11 is provided with insertion depth setting means. For example, to provide two steps of insertion depth, guide pieces 20-R and 20-F are formed on both end faces 11R and 11F of the connector body 11 to project outwardly thereof, and the distance $l_1$ between the end face 41 of each of the guide pieces 20-R and 20-F on the opposite side from the front face 11-T of the connector body 11 and rear face 11-B thereof differs from the distance $l_2$ between the stepped portions 11-S1 and 11-S2 and the rear face 11-B of the connector body 11. The stepped portions 11-S1 and 11-S2 and the guide pieces 20-R and 20-F constitute the insertion depth setting means. The distance $l_1$ and $l_2$ are selected so that $l_1 < l_2$ and, in the embodiment illustrated in FIG. 2, the distance $l_1$ is selected to be equal to the thickness S of the printed-circuit board 15. When the connector body 11 is inserted into the rectangular insertion hole 16 of the printed-circuit board 15 shown in FIG. 1, the end faces 41 of the guide pieces 20-R and 20-F abut against the surface of the printed-circuit board 15 at the marginal edges of the insertion hole 16 in its lengthwise direction, controlling the insertion depth of the connector body 11. In this embodiment, the rear face 11-B of the connector body 11 thus loaded on the printed-circuit board 15 is flush with the underside of the latter.

After the connector body 11 has been loaded on the printed-circuit board 15 as described above, the laminar conductors 17-1 to 17-n and 18-1 to 18-n on the printed-circuit board 15 are connected by soldering to the contact terminals 25-l to 25-n and 26-l to 26-n as indicated by 28-P and 29-P. That is to say, the pitch of arrangement of the contact terminals 25-P and 26-P (P=1, 2, . . . n) is equal to the pitch of arrangement of the laminar conductors 17-P and 18-P (P=1, 2, . . . n) and, by positioning of the connector body 11 by both ends of the insertion hole 16 in its lengthwise direction, the laminar conductors are disposed at one end adjacent the contact terminals.

Figure 3:
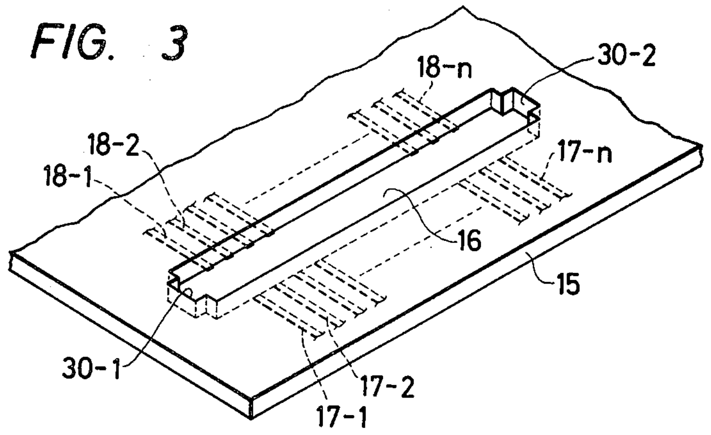
FIG. 3 is a perspective view showing another printed-circuit board for use with the connector depicted in FIG. 1.

In the case where the insertion depth of the connector body 11 is set by the stepped portions 11-S1 and 11-S2, a printed-circuit board 15 shown in FIG. 3 is employed, in which recesses 30-1 and 30-2 are formed at both end portions of the insertion hole 16 in its lengthwise direction. The recesses 30-1 and 30-2 are dimensioned to receive therein the guide pieces 20-R and 20-F, respectively. The laminar conductors 17-1 to 17-n and 18-1 to 18-n to the printed-circuit board 15 are formed on the side opposite from the side on which the connector body 11 is loaded.

Figure 4:
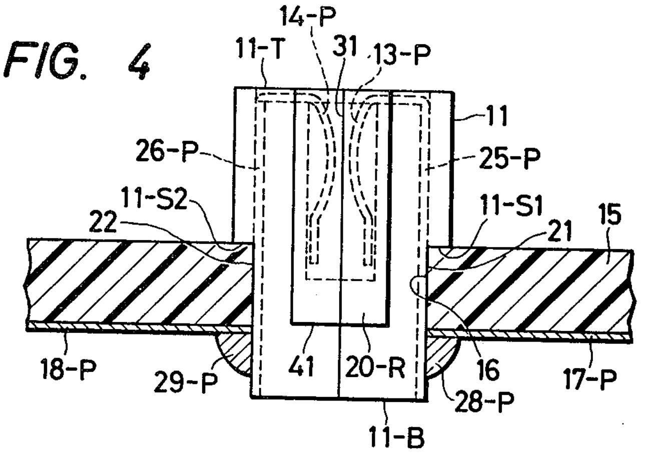
FIG. 4 is a diagram showing the state in which the connector depicted in FIG. 1 is loaded on the printed-circuit board of FIG. 3.

FIG. 4 shows the connector body 11 being loaded on the printed-circuit board 15 shown in FIG. 3. In this case, the guide pieces 20-R and 20-F are respectively inserted into the recesses 30-1 and 30-2, with the stepped portions 11-S1 and 11-S2 of the connector body 11 resting on the surface of the printed-circuit board 15 at both marginal edges of the insertion hole 16 in its lengthwise direction and the underside 11-B of the connector body 11 projecting out downwardly of the underside of the printed-circuit board 15. The contact terminals 25-P and 26-P (P=1, 2, . . . n) on the projecting portion and the corresponding laminar conductors 17-P and 18-P (P=1, 2, . . . n) are electrically connected by soldering as indicated by 28-P and 29-P (P=1, 2, . . . n).

Figure 5:
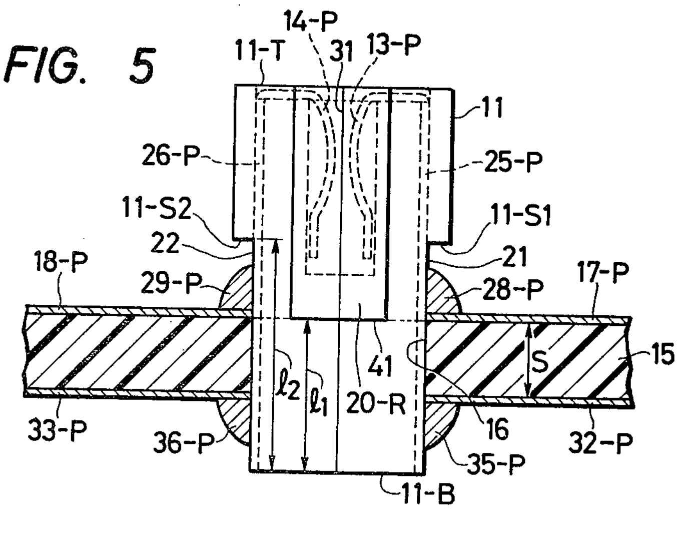
FIG. 5 is a diagram showing the state in which another example of the connector of the present invention is loaded on another printed-circuit board.

FIG. 5 illustrates another embodiment of the present invention, in which the distance $l_1$ between the end face 41 of each of the guide pieces 20-R and 20-F and the rear face 11-B of the connector body 11 is larger than the thickness S of the printed-circuit board 15 but smaller than the distance $l_2$ between the stepped portions 11-S1 and 11-S2 and the rear face 11-B of the connector body 11. The printed-circuit board 15 for use in this case has laminar conductors 17-P, 18-P, 32-P and 33-P formed on both sides thereof.

When this connector is loaded on the printed-circuit board 15, the contact terminals 25-1 to 25-n and 26-1 to 26-n extend through the insertion hole 16 of the printed-circuit board 15 so that they are exposed on both sides of the board 15. The contact terminals 25-P and 26-P (P=1, 2, . . . n) are alternately connected to the laminar conductors 17-1 to 17-m, 18-1 to 18-m and 32-1 to 32-m, 33-1 to 33-m on the top and bottom surfaces of the printed-circuit board 15, respectively. That is to say, the contact terminals 25-1, 25-3, 25-5, . . . and 26-1, 26-3, 26-5, . . . are respectively connected by soldering to the laminar conductors 17-1, 17-2, 17-3, . . . and 18-1, 18-2, 18-3, . . . as indicated by 28-1, 28-2, 28-3, . . . and 19-1, 29-2, 29-3, . . . , and the contact terminals 25-2, 25-4, 25-6, . . . and 26-2, 26-3, 26-6, . . . are respectively connected by soldering to the laminar conductors 32-1, 32-2, 32-3, . . . and 33-1, 33-2, 33-3, . . . as indicated by 35-1, 35-2, . . . and 36-1, 36-2, . . . Accordingly, in this embodiment, the pitch of arrangement of the laminar conductors can be reduced to nearly one-half that in the embodiment of FIG. 1. Thus, by selecting the insertion depth of the connector body 11 at a predetermined position on the printed-circuit board 15, the connector terminals can be connected to the laminar conductors of one or both sides of the printed-circuit board 15, so that the connector of the present invention is suitable for use with high-density packaged circuits.

While in the foregoing embodiments the contact terminals are disposed on both sides of the connector body 11, it is also possible to arrange the contact terminals only on one side of the connector body 11. In such a case, the laminar conductors are formed on one side of the insertion hole 16 of the printed-circuit board 15 correspondingly.

Figure 6:
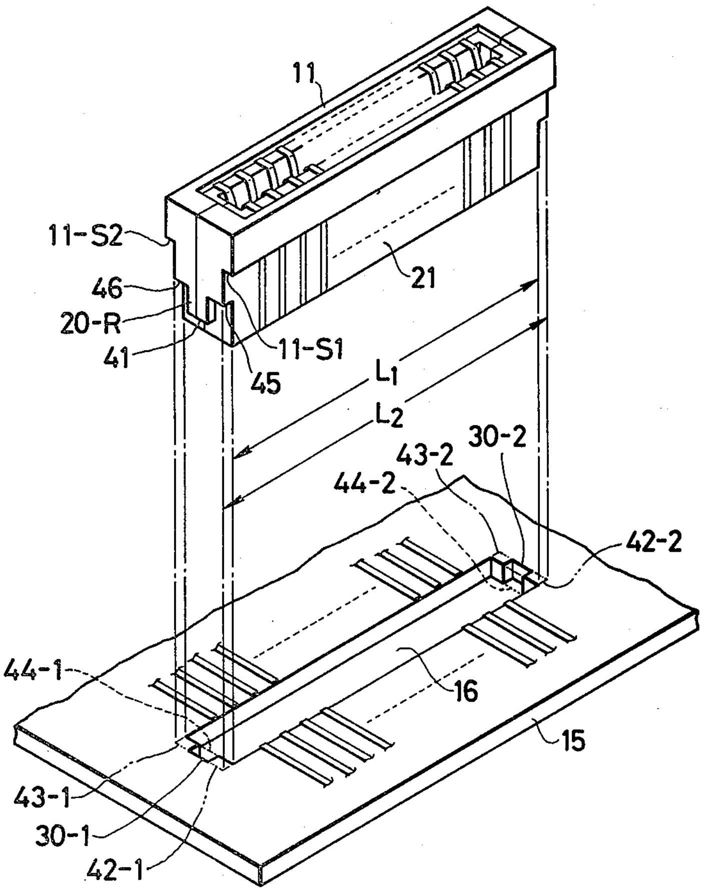
FIG. 6 is a perspective view showing a modification of insertion depth setting means of the connector of the present invention.

FIG. 6 illustrates another example of the insertion depth setting means which is designed for setting three insertion depths. As illustrated in FIG. 6, the guide piece 20-R is provided with shoulders 45 and 46, the positions of which are selected to be intermediate between the stepped portions 11-S1 and 11-S2 and the end face 41 of the guide piece. The guide piece 20-F, though not shown, also has the same construction as mentioned above. In order that the connector body 11 having such guide pieces may be disposed on the printed-circuit board 15 at a desired one of insertion depths, three kinds of insertion holes 16 of the printed-circuit board 15 are prepared. For setting the connector body 11 to the smallest insertion depth, the distance between the broken lines 44-1 and 44-2 indicating both ends of the insertion hole 16 is selected substantially equal to the length $L_1$ of the connector body 11 so that the end faces 41 may abut against the printed-circuit board 15. For setting the connector body 11 to the medium insertion depth, the insertion hole 16 is made in a shape indicated by the solid line to fit the narrowest portions of the guide pieces into recesses 30-1 and 30-2, respectively, so that the shoulders 45 and 46 may abut against the printed-circuit board 15. For setting the connector body 11 to the largest insertion depth, the insertion hole 16 is made in the form indicated by the broken lines 42-1, 43-1, 42-1 and 43-2 to have the same length as $L_2$ of the connector. It will be seen that the connector can be set to four insertion depths by further providing stepped portions intermediate between the shoulders 45 and 46 and the end faces 41 of the guide pieces.

As has been described in the foregoing, according to the present invention, the contact terminals are provided on either side of the connector body 11 and the connector body 11 is partly inserted into the insertion hole 16 of the printed-circuit board 15 and, in this case, since the laminar conductors on the printed-circuit board 15 are formed to extend to the marginal edges of the insertion hole 16 to make contact with the contact terminals, the pitch of the laminar conductors can be made smaller than in the prior art according to which contact terminals are respectively inserted into small holes individually made in a printed-circuit board; therefore, the present invention permits high density packing. Furthermore, since the connector body is provided with the means for setting its insertion depth into the printed-circuit board in a plurality of stages, it can be connected to the laminar conductors formed on either one or both of the front and rear surfaces of the printed circuit board by a mere selection of the printed-circuit board used, that is, without the necessity of providing a special attachment for loading. Especially in the case of connecting the connector body to the laminar conductors formed on both surfaces of the printed-circuit board, the packing density can be further increased.

It will be apparent that many modifications may be effected without departing from the scope of the novel concepts of the present invention.

What is claimed is:

1. A connector comprising:

a connector body formed by an insulating member of substantially rectangular parallelepiped configuration and having a plug hole made in its front face to extend in its lengthwise direction;

a plurality of contacts arranged in said hole along at least one of two parallel inner side walls of the plug hole in its lengthwise direction;

a plurality of contact terminals respectively connected to said contacts and led out on at least one of two parallel side surfaces of the connector body parallel to its lengthwise direction, said contact terminals extending along the side surface in the direction of insertion of a plug into the plug hole; and insertion depth setting means formed on the outer peripheral surface of the connector body for controlling the depth of insertion of the connector body in a plurality of stages when that portion of the connector body on which the contact terminals are formed is inserted into an insertion hole made in a printed-circuit board on which the connector is to be loaded;

each of said contacts and each of the corresponding contact terminals being formed as a unitary structure comprising a substantially U-shaped resilient conductor strip an intermediate portion of which is fixedly buried in the connector body by molding, one end portion of each of said resilient conductor strips constituting the contact terminal portion of said strip, said one end portion being embedded in said connector body with the outer surface of said one end portion being exposed in substantially flush relation to the side surface of said connector body.

2. A connector for insertion into a printed circuit board comprising:

a connector body formed of an insulating member, said body being of substantially rectangular parallelepiped configuration having a front face, a rear face, two elongated side walls which define side faces extending parallel to each other, and two end faces, said front face having an elongated substantially rectangular plug hole therein which extends between said two side faces in parallel thereto;

insertion depth setting means formed on the outer peripheral surface of said connector body for controlling the depth of insertion of said connector body into an insertion hole in a printed circuit board in a plurality of stages, said insertion depth setting means comprising guide pieces respectively formed integrally with said end faces of said connector body to project outwardly therefrom and stepped portions formed on each of said side walls to define a thicker portion and a thinner portion of each said side wall adjacent said front face and said rear face, respectively, the distance between said rear face and either of said guide pieces being less than the distance between said rear face and said stepped portions; and an array of spaced, parallel conductor strips penetrating through said thicker portion of one of said side walls from said front face towards said rear face of said connector body, one end portion of each of said conductor strips being bent into said plug hole to form a contact and the other end portion of each of said conductor strips being led out as a contact terminal from said stepped portion to be substantially flush with the side face of said thinner portion.

3. A connector according to claim 2 wherein said distance between said rear face and said guide pieces is substantially equal to the thickness of the printed-circuit board.

4. A connector according to claim 2 wherein said distance between said rear face and said guide pieces is greater than the thickness of the printed-circuit board.

5. A connector according to claim 2, 3 or 4 including a second array of spaced, parallel conductor strips penetrating through said thicker portion of the other of said side walls, the conductor strips in said second array being disposed in opposing relation to respective ones of the conductor strips in said first-mentioned array.

6. A connector according to claim 2, 3 or 4 wherein intermediate portions of said conductor strips extending through said thicker portion of said side wall are fixedly buried in said side wall by molding.

* * * * *